(12) United States Patent
Serizawa et al.

(10) Patent No.: US 6,504,724 B2
(45) Date of Patent: Jan. 7, 2003

(54) STRUCTURE OF DRAWING OUT FLEXIBLE CIRCUIT MEMBER

(75) Inventors: Yasuyoshi Serizawa, Shizuoka-ken (JP); Takahiko Suzuki, Shizuoka-ken (JP); Minoru Kubota, Shizuoka-ken (JP); Kenji Iwasaki, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/984,189

(22) Filed: Oct. 29, 2001

(65) Prior Publication Data

US 2002/0051349 A1 May 2, 2002

(30) Foreign Application Priority Data

Oct. 31, 2000 (JP) .......................................... 2000-332838

(51) Int. Cl.7 ................................................. H05K 7/14
(52) U.S. Cl. ....................... 361/752; 361/749; 361/756; 361/759; 174/254
(58) Field of Search ............................... 361/749–752, 361/756, 758, 759; 174/254, 268; 439/77, 493

(56) References Cited

U.S. PATENT DOCUMENTS

| | | | | |
|---|---|---|---|---|
| 4,226,491 A | * | 10/1980 | Kazama et al. | 361/759 |
| 4,932,873 A | * | 6/1990 | La Shier | 439/77 |
| 5,798,907 A | * | 8/1998 | Janik | 361/749 |
| 6,097,607 A | * | 8/2000 | Carroll et al. | 361/752 |
| 6,104,618 A | * | 8/2000 | Loibl | 361/749 |

* cited by examiner

Primary Examiner—Kamand Cuneo
Assistant Examiner—John B. Vigushin
(74) Attorney, Agent, or Firm—Finnegan, Henderson, Farabow, Garrett, & Dunner, L.L.P.

(57) ABSTRACT

A first casing (11, 12) includes a first end (30, 31). A second casing (11, 12) is mated with the first casing (11, 12). The second casing (11, 12) includes a second end (30, 31) facing the first end (30, 31). A flexible circuit member (23) is housed between the first and second casings (11, 12). The circuit member (23) is drawn out from the first and second ends (30, 31). The circuit member (23) is retained between the first and second ends (30, 31) under pressure.

12 Claims, 5 Drawing Sheets

STRUCTURE OF DRAWING OUT FLEXIBLE CIRCUIT MEMBER

BACKGROUND OF THE INVENTION

The present invention relates to a structure of drawing out a flexible printed circuit member where a flexible printed circuit board is accommodated in a casing such as a unit, a protector or the like, and this circuit member is drawn out from the casing.

Provided to a door of an automobile is various electric equipment such as a power window driving mechanism, a door mirror driving mechanism, a door lock mechanism, a speaker or the like. In order to perform electrical connection for these electric equipment, many harnesses are wired. In this case, for simplifying wiring of the harnesses, there is employed a method that collective wiring is conducted using a flexible printed circuit board (FPC) on which a plurality of conductors have been printed, each flexible circuit member is drawn out from the board to each electric equipment and the circuit member is connected to target electric equipment. In this case, the circuit board is accommodated in a unit as a casing and the circuit member is drawn out from this unit.

SUMMARY OF THE INVENTION

The present invention has been achieved to solve the above problem. An object thereof is to provide a structure of drawing out a flexible circuit member where the flexible circuit member drawn out from a casing is increased in retaining performance so that a tensile force acting on the circuit member outside the casing is prevented from acting on the circuit board in the casing.

A first aspect of the invention provides a structure of drawing out a flexible circuit member. The structure includes a first casing including a first end. The structure includes a second casing mated with the first casing. The second casing includes a second end facing the first end. The structure includes a flexible circuit member housed between the first and second casings. The circuit member is drawn out from the first and second ends. The circuit member is retained between the first and second ends under pressure.

Preferably, the first and second ends are fitted in a holder. The circuit member is retained between the holder and one of the first and second ends, being drawn out.

Preferably, the first end includes a first protrusion extending therefrom toward the second end. The second end includes a second protrusion extending therefrom toward the first end. The circuit member is interposed and supported between the first and second protrusions.

Preferably, the first and second ends have elastic means filled therebetween for pressing on the circuit member.

Preferably, the first end has a protrusion. The second end has a recess engaged with the protrusion. The circuit member is interposed between the protrusion and the recess.

Preferably, the protrusion and recess have a filler filled therebetween.

Preferably, the circuit member includes a flexible printed circuit board.

A second aspect of the invention provides a structure of drawing out a flexible circuit member. The structure includes an outer casing including a first casing and a second casing mated with each other. The structure includes a flexible circuit member housed in the outer casing. The circuit member is drawn out from the first and second casings. The first casing includes a first retainer. The second casing includes a second retainer facing the first retainer. The first and second retainers have the circuit member retained therebetween.

Preferably, the first and second retainers have a holder pressed on outer sides thereof. The circuit member extending from the first and second retainers is interposed between an inner side of the holder and one of the outer sides, being drawn out.

Preferably, the first and second retainers have opposed faces with protrusions. The protrusions press on the circuit member therebetween for retaining the circuit member.

Preferably, the first and second retainers have opposed faces. The opposed faces have a frictional member provided therebetween. The frictional member contacts the circuit member under pressure for retaining.

Preferably, the circuit member has a flexible coating mounted thereto. One of opposed faces of the first and second retainers has a recess formed thereon in correspondence with the coating. Another of the opposed faces has a protrusion formed thereon. The protrusion is inserted in the recess.

BRIEF DESCRIPTION OF THE ACCOMPANYING DRAWINGS

These and other features, aspects, and advantage of the present invention will become better under stood with reference to the following description, appended claims, and accompanying drawings where:

DETAILED DESCRIPTION OF THE PREFERRED EMBODIMENTS

Embodiments of the present invention will be explained below with reference to the drawings.

Figure 1:
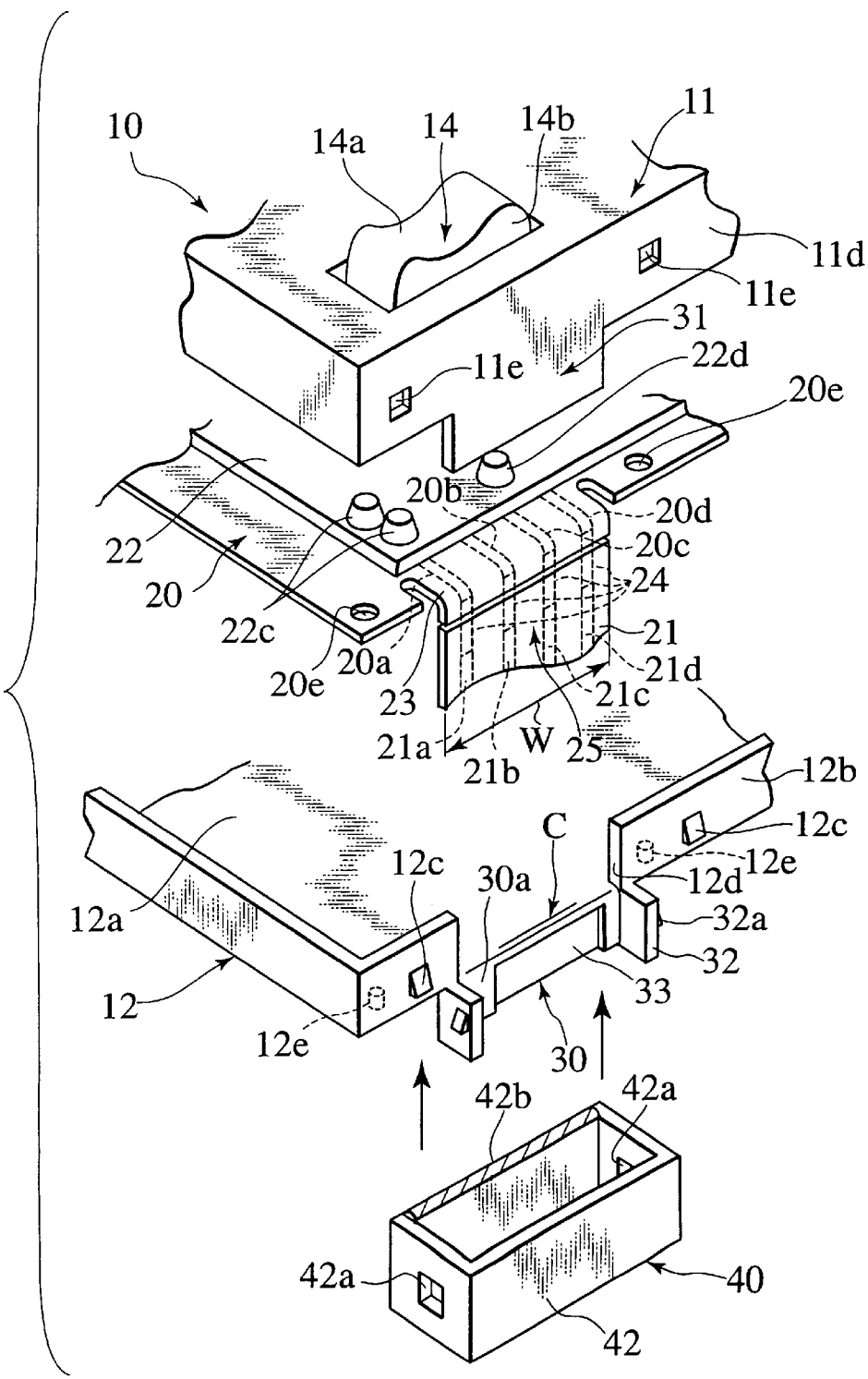
FIG. 1 is a exploded perspective view of a casing showing the drawn-out part of a flexible circuit member according to a first embodiment of the present invention.

As shown in FIG. 1, a flexible circuit drawing out structure according to this embodiment is provided with a flexible printed circuit board (FPC) 20 for a control board as a flexible circuit member, which is accommodated in a switch unit (casing) 10 for an automobile door. Extending from this board 20 is a flexible and flat lead wire 21 as a flexible circuit member to be drawn out. This lead wire 21 is drawn out from the switch unit 10.

Figure 2:
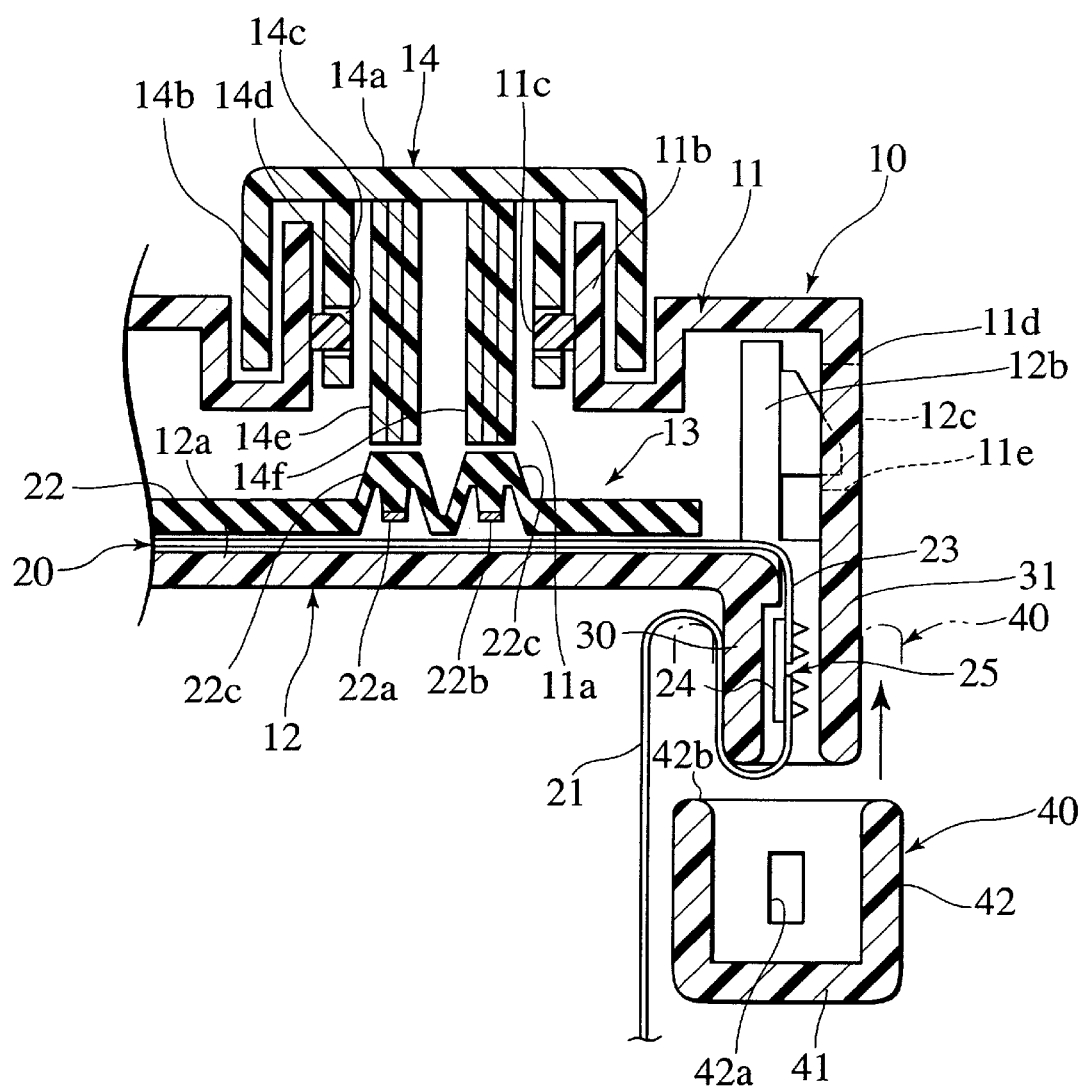
FIG. 2 is a cross-sectional view showing the drawn-out part of a flexible circuit member according to the first embodiment of the present invention.

That is, the switch unit 10 has an outer shell formed by an upper casing 11 made of synthetic resin, which serves as one of first and second casings, and a lower casing 12 made of synthetic resin, which serves as another of first and second casings. These upper and lower casings 11 and 12 are connected to each other, forming the accommodating space between the both casings for accommodating the board 20, as shown in FIG. 2. The upper casing 11 is provided with a key top 14 for a switch. By the operation of this key top 14, contact parts 22a and 22b in a rubber contact 22 provided on the board 20 are turned ON or OFF. For example, this switch is used as a driving switch of a power window.

In the key top 14, as shown in FIG. 2, side walls 14b are vertically provided so as to enclose a rectangular operating face 14a from a periphery thereof. This side walls 14b are loosely fitted in a recess outside of peripheral edge raised walls 11b of a switch mounting hole 11a formed in the upper case 11. In addition, positioned inside the peripheral edge erect walls 11b is inner walls 14c which extend downward from a back face of the operating face 14a. Engagement projections 11c projecting from an inner side of the peripheral edge walls 11b are respectively engaged with engagement holes 14d formed on the inner wall 14c, so that the key top 14 is prevented from falling off from the switch mounting hole 11a.

Furthermore, as shown in FIG. 1, two pairs of operation stems 14e and 14f, opposed each other, extend downward from a central part of the back face of the operating face 14a. The ends of these operation stems are arranged close to accommodation parts 22c and 22d of contact parts 22a and 22b protruding from rubber contact 22. Then, by inclining the operating face 14a forward or rearward along the operation stems 14e and 14f, one of these operation stems 14e and 14f presses corresponding one of the accommodation parts 22c and 22d. The pressed one of the contact parts 22a and 22b is turned ON. The non-pressed one of the contact parts is maintained in an OFF state.

One end of the board 20 is provided in a projecting manner with a connection part 23 of a lead wire 21 having a width W equal to the width of the lead wire 21. A plurality of conductors 20a to 20d to be drawn out are wired in this connection part 23. That is, the board 20 is formed by disposing conductors such as copper foils on a surface of a base film in a close contacting manner, as is known in general. This board is insulatedly coated with a cover-lay film. The conductors 20a to 20d are wired by processing a copper foil using an etching process or a plating process.

On the other hand, the lead wire 21 is formed of an FFC (flexible flat cable) or the like. That is, as known in general, this FFC is formed by interposing conductors such as copper foils between base films, using adhesive. Disposed in the lead wire 21 are conductors 21a to 21d of the same number as that of the conductors 20a to 20d introduced in the connection part 23.

Figure 3:
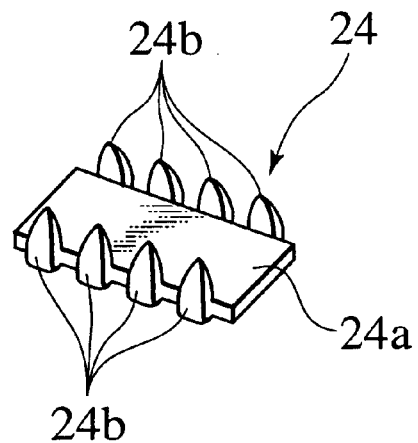
FIG. 3 is a perspective view of a connecting fixture which connects the drawn-out part of a flexible circuit member and the primary part of a flexible printed wiring board, according to the first embodiment of the present invention.

Then, the end of the lead wire 21 is connected to the connection part 23. Thereby, this lead wire 21 extends from the flexible print board 20. At this time, the insulation coated on the ends of conductors 20a to 20d introduced into the connection part 23 and an insulation coated on the ends of the conductors 21a to 21d are respectively cut and removed. The conductors 20a to 20d and the conductors 21a to 21d are connected to each other by a connection fixture which is a so-called "piercing terminal" 24 in a corresponding manner. Namely, as shown in FIGS. 3, in this piercing terminal 24, a plurality of piercing claws 24b are perpendicularly provided on the both sides of a rectangular primary part 24a formed of a conductor member such as a copper plate or the like. The piercing terminal 24 is located between conductors to be connected. The piercing claws 24b are pierced on both sides of each conductor. The respective opposed piercing claws 24b are caulked.

As shown in FIG. 1, the lower casing 12 of the switch unit 10 is formed such that its bottom face 12a approximately conforms with an outer configuration of the board 20. A side wall 12b is formed so as to enclose the bottom face 12a at a periphery thereof. Meanwhile, the upper casing 11 is formed with a side wall 11d mated with an outer periphery of the side wall 12b of the lower casing 12. In a mating state of these both side walls 11d and 12b, engagement claws (engagement parts) 12c, projecting from the outer side of the side wall 12b of the lower casing 12, are engaged with lock holes (engagement parts) 11e formed to the side wall 11d of the upper casing 11, which maintains both the casings in a connected state.

Here, as shown in FIG. 1, the portion of the side wall 12b of the lower casing 12, corresponding with the connection part 23 of the board 20, is cut off by the width W of the connection part 23. The cut-off part 12d has a first retainer 30 formed thereto, projecting by a predetermined length L from the bottom face 12a perpendicularly towards an opposing side (downward in FIG. 1) of the upper casing 11. At this time, a corner C, extending from the bottom face 12a to the first retainer 30, is manufactured as an arc face. On the other hand, the side wall 11d of the upper casing 11 has a second retainer facing the first retainer 30, with approximately the identical length to that of the first retainer 30. Then, a clearance between the first retainer 30 and the second retainer 31 is established at a clearance dimension which enables a drawn-out part 25, extending from the connection part 23 of the board 20, to the lead wire 21 to be effectively retained between the first and second retainers 30 and 31.

The both sides of the first retainer 30 respectively have separation walls 32 projecting therefrom, which close the both sides between the first retainer 30 and the second retainer 31. These first and second retainers 30 and 31, and separation walls 32 form a flat and rectangular closed section. Also, a recess groove 33 for the terminal 24 is recessed from an inner face 30a of the first retainer 30 corresponding to the second retainer 31.

Then, when the lead wire 21 is drawn out from the unit 10, the drawn-out part 25 of the board 20 is located at the cut-off part 12d, with the upper case 11 being detached from the lower casing 12. By the connection of the upper casing 11 to the lower casing 12 in this state, the drawn-out part 25 is retained between the first retainer 30 and the second retainer 31 while being bent downward. The lead wire 21, joined to this drawn out part 25, is drawn out from the clearance between distal ends of the first retainer 30 and the second retainer 31.

Meanwhile, as shown in FIG. 2, a synthetic resin-made holder 40, press-fitted from a direction of the respective distal ends of the first retainer 30 and the second retainer 31, is provided outside of the first retainer 30 and the second retainer 31. This holder 40 is formed in a rectangular cup shape with a bottom wall 41 and a side wall 42 extending along a peripheral edge thereof. With the holder 40 being press fitted with the first and second retainer 30 and 31, lock claws (engagement parts) 32a, protruding from the outsides of the separation walls 32, are engaged with lock holes (engagement parts) 42a formed on the side wall 42 of the holder 40 facing the lock claws 32*a,* so that the holder 40 is prevented from dropping off.

Then, as shown in FIG. 2, by press-fitting the holder 40 with the outsides of the first and second retainers 30 and 31, the lead wire 21, protruding from the clearance between the distal ends of these first and second retainers 30 and 31, is interposed between the outside of the first retainer 30 and the inside of this holder 40. The lead wire 21 is drawn out from a distal end of the side wall 42 of the holder 40. A corner 42*b* (shown by oblique lines in FIG. 1) of a distal end of this side wall 42, through which the lead wire 21 is drawn out, is manufactured as an arc face (curved face). Incidentally, the lead wire 21 is located between the outside of the second retainer 31 and the inside of the holder 40.

Also, a pair of protrusions 12*e* and 12*e,* protruding from the bottom wall 12*a* of the lower casing 12, is positioned on the both sides of the cut-off part 12*d* of the side wall 12*b*. Meanwhile, a pair of fixing holes 20*e* is formed on both side parts of connection part 23 of the board 20. By fitting protrusions 20*e* in the fixing holes 20*e,* the flexible print board 20 is positioned and it is prevented from displacing.

With the flexible circuit member drawing out structure of the present embodiment thus configured, the lead wire 21, connected to the board 20 within the switch unit 10, is drawn out through a clearance between the first retainer 30 and the second retainer 31 respectively provided to the lower casing 12 and the upper casing 11. At this time, the clearance between the first retainer 30 and the second retainer 31 is set at a clearance dimension which enables the drawn-out part 25 extending from the connection part 23 of the flexible printed board 20 to the lead wire 21 to be effectively retained therebetween. At this time, since the first retainer 30 and the second retainer 31 protrude by a predetermined length, the area of the retaining part of the drawn-out part 25 is increased. Thereby, the retaining performance for retaining the drawn-out part 25 is improved. Therefore, even when a tensile force acts on the lead wire 21, acting the tensile on the connection part 23 and the board 20 is prevented or reduced. Thus, such a drawback as the detachment of this connection part 23 and the displacement of the flexible print board 20 are prevented.

Also, in this embodiment, the holder 40 is press mated with the outsides of the first and second retainers 30 and 31. The lead wire 21, drawn from the distal ends of the first and second retainers 30 and 31, is drawn out from the distal end of the side wall 42 of the holder 40, with it interposed between the outside of the first retainer 30 and the inside of the holder 40. Thereby, a press-fitting force of the holder 40 is caused to act on this retaining part to be capable of retaining the leas wire 21. For this reason, the retaining force of the holder 40 for retaining the lead wire 21 is added to the retaining force of the first and second retainers 30 and 31 for retaining the drawn-out part 25. As a result, the entire retaining performance for retaining the drawn-out part 25 is further enhanced.

In this embodiment, the case that the holder 40 is press-fitted with the first and second retainers 30 and 31 has been described, but using the holder 40 is not required necessarily in this invention.

Figure 4:
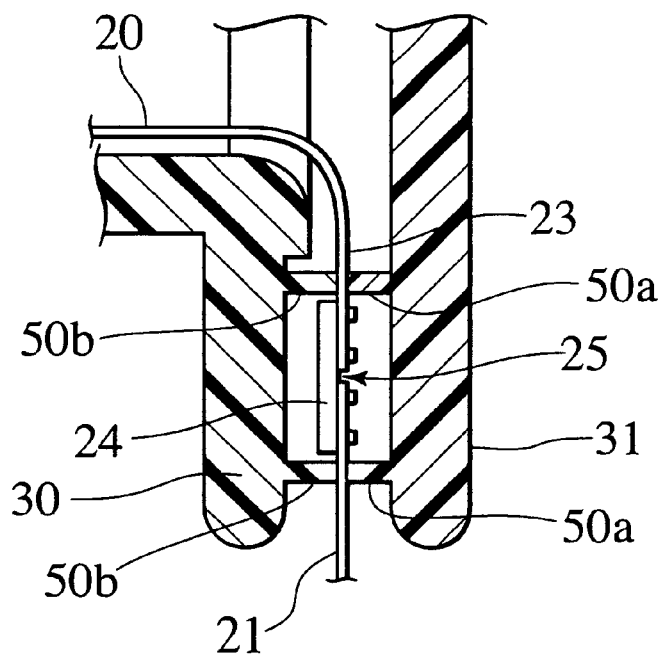
FIG. 4 is an enlarged sectional view of the primary part of a retainer showing a second embodiment of the present invention.

FIG. 4 shows a second embodiment of the present invention. The same constituent elements as those in the first embodiment are attached with the same reference characters as those in the first embodiment and duplicate explanation thereof will be omitted. That is, the second embodiment and the first embodiment are mainly different in a point that respective pairs of ribs 50*b* and 50*a* which hold the drawn-out part 25 of the lead wire 21 in a pressing manner and which serve as protrusions are formed integrally on opposed faces of the first and second retainers 30 and 31.

Regarding the respective ribs 50*b* and 50*a,* the ribs 50*b* protrude from the first retainer 30 and the other ribs 50*a* protrude from the second retainer 31. Respective distal ends opposed to each other are disposed so as to be opposed to each other with a clearance slightly smaller than the thickness of the flexible printed board 20 or the lead wire 21. Also, in this embodiment, these paired ribs 50*b* and 50*a* are provided in two pairs on both ends of the retainers 30 and 31, with the terminal 24 of the connection part 23 interposed therebetween.

Accordingly, in this embodiment, by connecting the upper casing 11 and the lower casing 12, the drawn-out part 25 of the lead wire 21 is pressed and retained by the ribs 50*b* and 50*a* formed on the opposing faces of the first and second retainers 30 and 31. Thereby, the retaining performance for retaining the drawn-out part 25 is further improved. Especially, in this embodiment, since the respective ribs 50*b* and 50*a* are provided in two pairs, the retaining performance for the drawn-out part 25 is still further enhanced.

Incidentally, providing the ribs 50*b* and 50*a* as the protrusions for pressing and holding the drawn-out part 25, has been explained. This invention is not limited to this case, but projecting parts formed integrally with the retainers 30 and 31 or other members different from the retainers be preferably used as the protrusions.

Figure 5A:
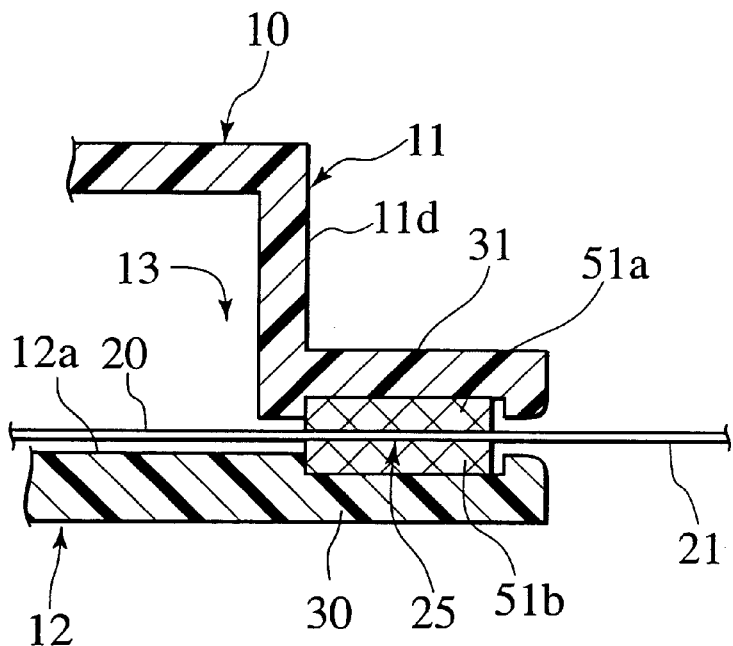
FIG. 5A is an enlarged sectional view of a primary part of a retainer showing a third embodiment of the present invention.

FIG. 5A shows a third embodiment of the present invention. That is, a main difference between the third embodiment and the first and second embodiments is that adhesives 51*b* and 51*a* each serving as a large friction member for pressing and retaining the drawn-out part 25 of the lead wire 21 are provided on the opposed faces of the first and second retainers 30 and 31. Incidentally, in this embodiment, the first and second retainers 30 and 31 are disposed in a direction of extension of the bottom wall 12*a* of the lower casing 12.

The adhesives 51*b* and 51*a* each have a predetermined thickness and elasticity. One adhesive 51*b* is adhered to the first retainer 30 and the other adhesive 51*a* is adhered to the second retainer 31 respectively by pressure sensitive adhesive double coated tapes or the like.

Accordingly, in this embodiment, by joining the upper casing 11 and the lower casing 12, the drawn-out part 25 of the lead wire 21 is pressed and held by the adhesives 51*b* and 51*a* adhered to the opposed faces of the first and second retainers 30 and 31. At this time, since the adhesives 51*b* and 51*a* are brought in area contact with the drawn-out part 25, a large friction force is generated against a tensile force of the lead wire 21. Since this friction force can resist a large shearing stress, the retaining performance for the drawn-out part 25 of the lead wire 21 is improved.

Incidentally, the large friction members to be used are not limited to the adhesives 51*b* and 51*a,* but any member generating a large frictional force is preferably used as a large friction member, for example, soft rubber material is to be used.

Figure 5B:
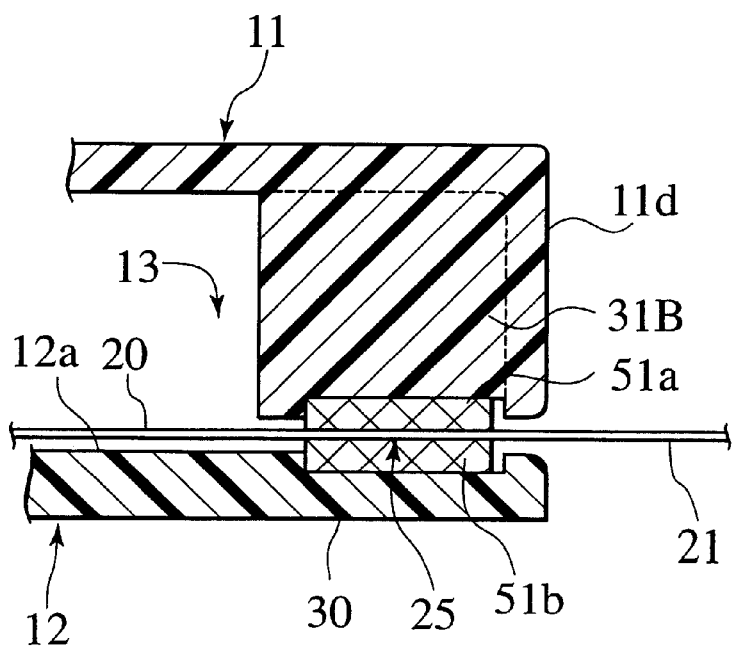
FIG. 5B is an enlarged sectional view of a primary part of a retail showing a modified embodiment of the third embodiment of the present invention.

Also, FIG. 5B shows a modified embodiment of the third embodiment of the present invention, where an inner central part of the side wall 11*d* of the upper casing 11 is formed thicker, serving as a second retainer 31B. Thereby, the upper casing 25 11 and the lower casing 12 are joined without protruding the second retainer 31B from the side wall 11*d* of the upper casing 11. Therefore, the drawn-out part 25 of the lead wire 21 is sandwiched and retained by the adhesives 51b and 51a adhered to the respective opposed faces of the first retainer 30 and 30 the thicker second retainer 31B.

Figure 6:
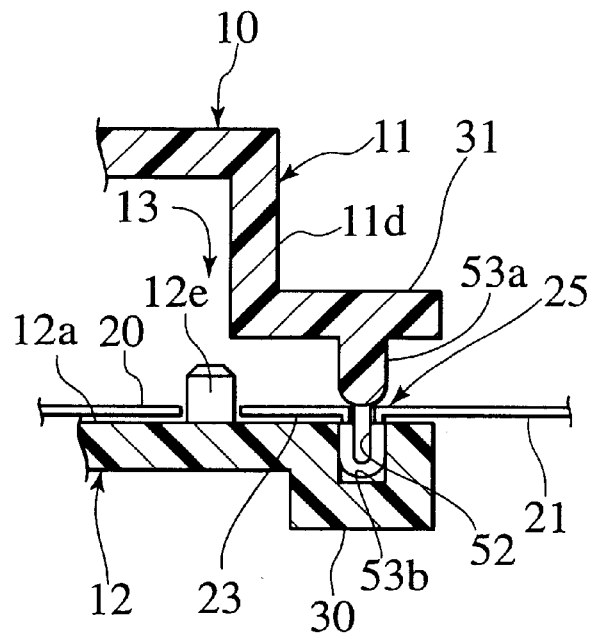
FIG. 6 is an enlarged sectional view of a primary part of a retainer showing a fourth embodiment of the present invention.
Figure 7:
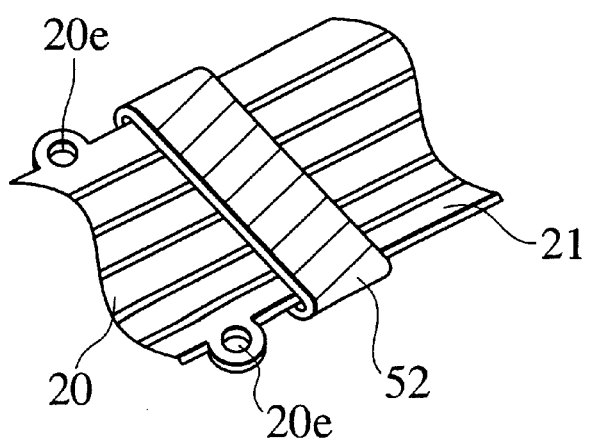
FIG. 7 is a perspective view of the drawn-out part of a flexible circuit member showing a fourth embodiment of the present invention.

FIG. 6 and FIG. 7 show a fourth embodiment of the present invention. That is, a difference between the fourth embodiment and the respective embodiments is that a felt 52 serving as a flexible coat material is attached to the drawn-out part 25 of the lead wire 21 and the felt 52 is clamped between a recess 53b and a protrusion 53a provided on the first and second retainers 30 and 31, respectively. Incidentally, even in this embodiment, the first and second retainers 30 and 31 are arranged in a direction of extension of the bottom wall 12a of the lower casing 12 like the second embodiment.

As shown in FIG. 6, regarding the recess 53b and the protrusion 53a, the recess 53b is provided on the first retainer 30, and the protrusion 53a is provided on the second retainer 31. The felt 52 has been wound around the outer periphery of the drawn-out part 25 of the lead wire 21. Then, the winding part of the felt 52 is disposed in the recess 53b. In this state, by joining the upper casing 11 and the lower casing 12, the winding part of the felt 52 is pressed into the recess 53b by the protrusion 53a.

Accordingly, in this embodiment, the felt 52 wound on the drawn-out part 52 of the lead wire 21 is interposed between the recess 53b and the protrusion 53a while being deformed so that the retaining performance for the drawn-out part 25 is enhanced by the winding part of the felt 52. Even when the lead wire 21 is interposed between the recess 53b and the protrusion 53a, the interposed part of the lead wire 21 is protected by the felt 52. Thereby, such a drawback as damage or breakage of the lead wire 21 is prevented from occurring.

Incidentally, the flexible coating member to be used is not limited to the felt 52, but a member which is brought in close contact with the protrusion 53b and the recess 53a while protecting the drawn-out part 25 of the lead wire 21, for example, adhesive, is preferably used as the flexible coating member. Alternately, the recess 53b is preferably formed in the second retainer 31 and the protrusion 53a is preferably formed in the first retainer 30.

Even in the second to fourth embodiments, the holder 40 of the first embodiment is preferably used. By press-fitting this holder 40 with the first and second retainers 30 and 31, the retaining performance for the lead wire 21 in the second to fourth embodiments is further improved.

Also, in each of the above embodiments, upon providing the lead wire 21 extending from the board 20, the case that these board 20 and lead wire 21 separated from each other are interconnected to each other, using a connection fixture such as a piercing terminal 24 or the like, has been described. The present invention is not limited to such a case, but the present invention is applicable to even a case that the lead wire 21 extends integrally from the flexible printed board 20.

Furthermore, in each embodiment, the case that the lead wire 21 which is the flexible circuit member to be drawn out extends from the board 20 serving as the primary part of the flexible circuit member, has been explained as one example. The primary part of these flexible circuit member or the flexible circuit member to be drawn out is preferably constituted with such a flexible and flat circuit member as a FPC (flexible print circuit) or a FFC (flexible flat cable).

Furthermore, in each embodiment, the switch unit has been used as the casing, but each embodiment is, of course, applicable to a protector serving as a protect box or the like.

As mentioned above, both retainers, which have the drawn-out part of the flexible circuit member interposed there between, are increased in retaining areas, enhancing the retaining performance for the drawn-out part. Accordingly, even when a tensile force acts on the circuit member, acting the tensile force on the circuit member itself or the drawn-out part is prevented or reduced, thus solving a drawback due to the tensile force.

The retaining force of the circuit member due to press-fitting of the holder is added to the retaining force of the both retainers, further enhancing the retaining performance for the drawn-out part of the circuit member.

Since the drawn-out part of the circuit member is pressed and retained by means of the protrusions, the retaining performance for the drawn-out part further increases.

The retaining performance for the drawn-out part is further increased by a large friction force generated between the drawn-out part and the both retainers.

Since the flexible coating as well as the drawn-out part is interposed between the recess and the protrusion while being deformed, the retaining performance for the drawn-out part is elevated. Since the circuit member, interposed between the recess and the protrusion, is protected by the flexible coating, the circuit member is prevented from being damaged. The entire content of Japanese Patent Applications P2000-332838 (filed on Oct. 31, 2000) is incorporated herein by reference.

Although the invention has been described above by reference to certain embodiments of the invention, the invention is not limited to the embodiments described above. Modifications and variations of the embodiments described above will occur to those skilled in the art, in light of the above teachings. The scope of the invention is defined with reference to the following claims.

What is claimed is:

1. A structure of drawing out a flexible circuit member, the structure comprising:
    an outer casing comprising
        a first casing including a first retainer, and
        a second casing including a second retainer, the second casing being mated with the first casing such that the second retainer faces the first retainer; and
    a flexible circuit member housed in the outer casing, the flexible circuit member being drawn out from the first and second casings,
    wherein the flexible circuit member is retained between the first and second retainers in a region of the flexible circuit member that is provided with at least one bend.

2. The structure of claim 1, further comprising a holder having inner sides,
    wherein the first and second retainers have outer sides, and the flexible circuit member extending from the first and second retainers is interposed between an inner side of the holder arid one of the outer sides of the first and second retainers.

3. The structure of claim 1, wherein the first and second retainers have opposed faces with protrusions, and the protrusions press on the flexible circuit member located therebetween for retaining the flexible circuit member.

4. The structure of claim 1, wherein the first and second retainers have opposed faces, the opposed faces having a frictional member provided therebetween, and
    wherein the frictional member contacts the flexible circuit member for retaining the flexible circuit member under pressure.

5. The structure of claim 1, wherein the flexible circuit member further comprises a flexible coating mounted thereto, one of the opposed faces of the first and second retainers has a recess formed thereon corresponding with the coating, and the other of the opposed faces has a protrusion formed thereon inserted in the recess.

6. A structure of drawing out a flexible circuit member, the structure comprising:

a first casing including a first end;

a second casing mated with the first casing, the second casing including a second end facing the first end; and a flexible circuit member housed between the first and second casings, the flexible circuit member being drawn out from the first and second ends, wherein the flexible circuit member is retained between the first and second ends under pressure in a region of the flexible circuit member that is provided with at least one bend.

7. The structure of claim 6, further comprising a holder, wherein the first and second ends are fitted in the holder, and the flexible circuit member is retained between the holder and one of the first and second ends.

8. The structure of claim 6, wherein the first end includes a first protrusion extending therefrom toward the second end, the second end includes a second protrusion extending therefrom toward the first end, and the flexible circuit member is interposed and supported between the first and second protrusions.

9. The structure of claim 6, wherein the first end has a protrusion, the second end has a recess engaged with the protrusion, and the flexible circuit member is interposed between the protrusion and the recess.

10. The structure of claim 9, wherein the protrusion and recess have a filler therebetween.

11. The structure of claim 6, wherein the flexible circuit member includes a flexible printed circuit board.

12. A structure of drawing out a flexible circuit member, the structure comprising:

a first casing including a first end;

a second casing mated with the first casing, the second casing including a second end facing the first end; and a flexible circuit member housed between the first and second casings, the flexible circuit member being drawn out from the first and second ends, wherein the flexible circuit member is retained between the first and second ends under pressure, and wherein the first and second ends have elastic means filled therebetween for pressing on the flexible circuit member.

* * * * *